(12) United States Patent
Zhu et al.

(10) Patent No.: US 9,497,361 B2
(45) Date of Patent: Nov. 15, 2016

(54) METHOD AND SYSTEM FOR CMOS IMAGE SENSING DEVICE

(71) Applicant: SEMICONDUCTOR MANUFACTURING INTERNATIONAL (SHANGHAI) CORPORATION, Shanghai (CN)

(72) Inventors: Hong Zhu, Shanghai (CN); Jianping Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/995,168

(22) Filed: Jan. 13, 2016

(65) Prior Publication Data

US 2016/0156819 A1    Jun. 2, 2016

Related U.S. Application Data

(62) Division of application No. 12/848,229, filed on Aug. 2, 2010, now Pat. No. 9,269,625.

(30) Foreign Application Priority Data

Aug. 28, 2009 (CN) .......................... 2009 1 0104789

(51) Int. Cl.
*H04N 5/225* (2006.01)
*H01L 21/822* (2006.01)
*H01L 27/146* (2006.01)
*H04N 5/374* (2011.01)

(52) U.S. Cl.
CPC .......... *H04N 5/2253* (2013.01); *H01L 21/822* (2013.01); *H01L 27/146* (2013.01); *H01L 27/1463* (2013.01); *H01L 27/14603* (2013.01); *H01L 27/14636* (2013.01); *H01L 27/14643* (2013.01); *H04N 5/374* (2013.01); *Y02P 70/521* (2015.11)

(58) Field of Classification Search
None
See application file for complete search history.

*Primary Examiner* — Roberto Velez
*Assistant Examiner* — Stephen Coleman
(74) *Attorney, Agent, or Firm* — Kilpatrick Townsend and Stockton LLP

(57) ABSTRACT

Method and system for manufacturing CMOS image sensing device with reduced blooming. The method includes a step for providing a substrate material. The substrate material can be characterized by a first dimension and a second dimension. In addition, the method includes a step for defining an active region on the substrate material. The active region is characterized by a third dimension and a fourth dimension. The method further includes a step for defining a non-active region on the substrate material. The non-active region is different from the active region. The non-active region is characterized by a fifth dimension and a sixth dimension, the non-active region including a silicon material. The method includes a step for defining a depletion region within the active region. In addition, the method includes a step for forming an n-type region positioned above the depletion region.

11 Claims, 6 Drawing Sheets

METHOD AND SYSTEM FOR CMOS IMAGE SENSING DEVICE

CROSS-REFERENCES TO RELATED APPLICATIONS

This application is a divisional application of U.S. patent application Ser. No. 12/848,229, filed Aug. 2, 2010, which claims priority to Chinese Patent No. 200910104789.8 filed on Aug. 28, 2009, commonly assigned and hereby incorporated by reference for all purposes.

BACKGROUND OF THE INVENTION

This invention is directed to imaging techniques. More particularly, embodiments the invention provide a method and system for capturing images on CMOS color sensors. Merely by way of example, embodiments of the invention have been used to reduce and eliminate blooming effects in image capturing. But it would be recognized that the invention has a much broader range of applicability.

To capture vivid imageries have long been an endeavor that persisted as long as the human race itself. As early as the Stone Age, people tried to capture of what they see with cave drawings. Over the thousands of years, artists developed techniques for capturing images with paint brushes and canvases. With oil paintings, artists have been able to capture real world images with accuracy, but the fidelity of paintings is no match to photography.

In 1826, a French inventor Nicéphore Niépce produced the first photographic image on polished pewter plate covered with a petroleum derivative. Since then, the technique for photographic imaging evolved. Better techniques and equipment improved image quality over the next hundred of years. Over the last fifty years, techniques for color photography have been improved and consummated. In the last decade, with the introduction of the first commercially available digital camera by Kodak in 1990, a new type of image capturing technique, digital imaging, has rapidly become a popular way for capturing images.

For digital imaging, the image sensor (or digital equivalent of film negatives) is one of the most important components for digital imaging devices, such as digital cameras, camera phones, etc. For a long time, image sensors have been based on charge-coupled device (CCD) technology that has been developed by George Smith and Willard Boyle at Bell Labs. In the past, CCD based imaging devices dominated. Recently, CMOS based image sensors have become more popular.

The CMOS image sensor technology typically includes millions of sensor pixels (light sensing units), each of the sensor pixel includes two to four transistors and a photodiode. Typically, conventional techniques for CMOS image sensing use one np junction, with very shallow p+ layer applied on top of N region to reduce noise and enhance blue response in image capturing process. In a way, the CMOS sensor unit works in a similar manner as a capacitor. The more charge stored in the electrode, the higher the voltage drop across the depletion region of the CMOS. Light, which is an energy source, generates free carriers. The free carriers under electric field run towards the N type region of the CMOS sensor and neutralized the charge and reduce potential. The voltage difference before and after the integration of energy provides a signal level. The signal level is then used as a reading as the amount of light being detected and used for forming an image.

Depending upon applications, CMOS sensor often have advantages over CCD sensors. For example, compared to CCD image sensors, CMOS sensors usually provide lower costs and longer battery life. As a result, CMOS is often preferred for portable imaging devices such as camera phone and point and shoot cameras. At the high end, CCD image sensors are often behind CMOS images sensors in terms of noise level and sensitivity. Because of various advantages of CMOS image sensors, the technologies for CMOS image sensors have been rapidly developing.

The capability of image sensor is often measure by the number of image sensors (or pixels). In the recent years, camera makers have been racing one another for producing new cameras with higher pixel count. The resolution of CMOS image sensor has been increasing as pixel size shrink together with the MOS transistor channel length. While the increase resolution of image sensors often improve image resolution, the decreased pixel size and increase noise level have become obstacles for improved image quality. As a result of higher pixel density and decreased pixel size, images produced for CMOS censors often suffer from unwanted artifacts such as moir, fringing, blooming, etc.

Various conventional techniques have been developed to improve image quality and to reduce and even eliminate unwanted artifacts. However, conventional techniques are often inadequate.

Therefore, it is desirable to have an improved method and system for a CMOS image sensing device.

BRIEF SUMMARY OF THE INVENTION

This invention is directed to imaging techniques. More particularly, embodiments of the invention provide a method and system for capturing images on CMOS color sensors. Merely by way of example, embodiments of the invention have been used to reduce and eliminate blooming effects in image capturing. But it would be recognized that the invention has a much broader range of applicability.

An embodiment of the present invention provides a method for manufacturing a CMOS image sensor. Among other things, the CMOS image sensor is characterized by reduced blooming. The method includes a step for providing a substrate material. The substrate material can be characterized by a first dimension and a second dimension. In addition, the method includes a step for defining an active region on the substrate material. The active region is characterized by a third dimension and a fourth dimension. The method further includes a step for defining a non-active region on the substrate material. The non-active region is different from the active region. The non-active region is characterized by a fifth dimension and a sixth dimension, the non-active region including essentially pure silicon material. The method additionally includes a step for defining a depletion region within the active region. In addition, the method includes a step for forming an n-type region positioned above the depletion region. The n-type region is within the active region. Furthermore, the method includes a step for forming a gate region within the active region. In addition, the method includes a step for forming a doped region, the doped region being within the non-active region. The doped region is characterized by including at least one substance at a predetermined range of concentration. The doped region further can be characterized by a doping concentration. Moreover, the method includes a step for forming a plurality of voids within the doped region.

Another embodiment of the present invention provides a pixel of a CMOS image sensor, which is characterized by reduced blooming. The pixel includes a p-type silicon substrate, which includes a top side and a bottom side. The pixel also includes an active region being defined inside the p-type silicon substrate. The active region includes a depletion region and a n-type silicon material. The active region is positioned within the p-type silicon substrate, wherein the active region is characterized by a first dimension and a second dimension. The pixel additionally includes at least one metal line positioned at the proximity of the top side. In addition, the pixel includes a non-active region. The non-active region is different from the active region. The non-active region can be characterized by a first energy state. The pixel also includes at least one barrier region being outside of the active region. The at least one barrier region is characterized by a second energy state. The second energy state is different from the first energy state.

Yet another embodiment of the present invention provides an image capturing device. The image capturing device includes a user interface being configured to facilitate an image capturing process. The image capturing device also includes a first input being configured to receive a user input, the user input being a command for capturing an image. Additionally, the image capturing device includes an image sensor being configured to capture an image. Furthermore, the image capturing device includes an optical device being positioned to provide a light to form an image on the image sensor. In addition, the image capturing device includes a processor being configured to process images. The image sensor includes a p-type silicon substrate, the p-type silicon substrate including a top side and a bottom side. The image sensor also includes an active region being defined inside the p-type silicon substrate. The active region includes a depletion region and a n-type silicon material. The active region is positioned within the p-type silicon substrate, wherein the active region is characterized by a first dimension and a second dimension. The image sensor additionally includes at least one metal line positioned at the proximity of the top side. The image sensor also includes a non-active region, the non-active region being different from the active region. The non-active region is characterized by a first energy state. Moreover, the image sensor includes at least one barrier region being outside of the active region. The at least one barrier region can be characterized by a second energy state. The second energy state is different from the first energy state.

It is to be appreciated that the present invention provides various advantages. According to an embodiment, the present invention reduces the blooming effect on certain CMOS based image sensors. For example, hydrogen or helium implantation is used in conjunction with annealing technology during the fabrication process of CMOS image sensors. For example, the hydrogen or helium implantations create voids at desired regions of CMOS image sensors. During the process of capturing images, these voids reduce electrons from diffusing into adjacent image sensor regions and thereby reduces the blooming effect. As merely an example, these voids function as recombination center and potential barriers for electrons. Depending upon applications, the dimension (e.g., depth) and distribution of these voids can be controlled. For example, various factors (e.g., photolithography techniques, implant energy, implant dosage, and annealing temperature and time) can be changed to adjust the property of voids based on desired applications.

Depending upon embodiments, one or more of these benefits may be achieved. These benefits and various additional features and advantages of the present invention can be fully appreciated with reference to the detailed description and accompanying drawings that follow.

DETAILED DESCRIPTION OF THE INVENTION

This invention is directed to imaging techniques. More particularly, embodiments of the invention provide a method and system for capturing images on CMOS color sensors. Merely by way of example, embodiments of the invention have been used to reduce and eliminate blooming effects in image capturing. But it would be recognized that the invention has a much broader range of applicability.

Figure 1:
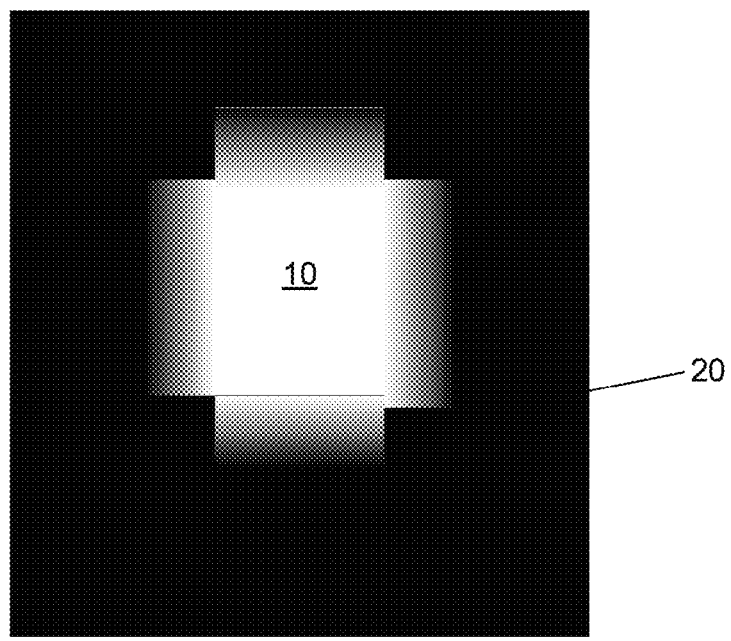
FIG. 1 is a simplified diagram illustrating a digital image suffering from blooming effect.

As discussed above, CMOS image sensors have various limitations. For example, the capability of image sensor is often measure by the number of image sensors (or pixels). In the recent years, camera makers have been racing one another for producing new cameras with higher pixel count. The resolution of CMOS image sensor has been increasing as pixel size shrink together with the MOS transistor channel length. While the increase resolution of image sensors often improve image resolution, the decreased pixel size and increase noise level have become obstacles for improved image quality. As a result of higher pixel density and decreased pixel size, images produced for CMOS censors often suffer from unwanted artifacts such as moiré, fringing, blooming, etc. FIG. 1 is a simplified diagram illustrating a digital image suffering from blooming effect. As seen in FIG. 1, the light area 10 and dark area 20 share blurred edges due to blooming effect. Typically, such blooming effect is undesired for an image.

Figure 2:
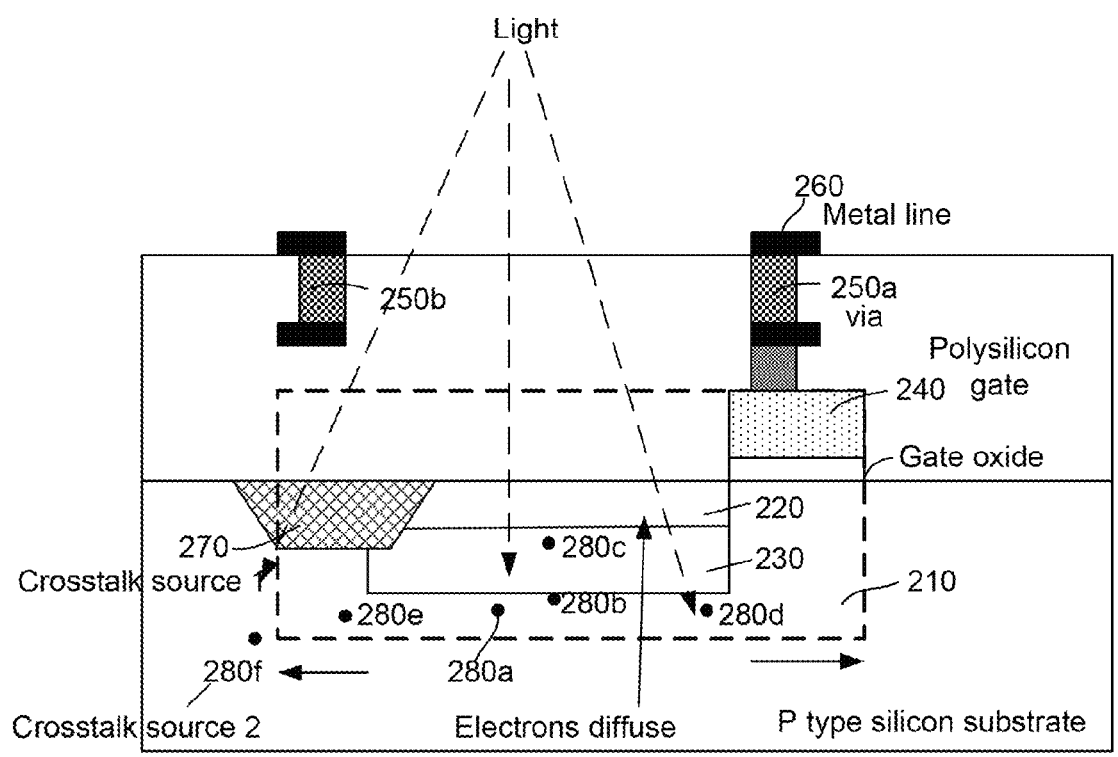
FIG. 2 is an illustration of a CMOS image sensor in operation.

To better explain the causes of blooming effect, an illustration of a CMOS image sensor in operation is presented according to FIG. 2. This diagram is merely an example, which should not unduly limit the scope of the claims. One of ordinary skill in the art would recognize many variations, alternatives, and modifications. Typically, a conventional CMOS-based active pixel 200 includes the following components:

1. active region 210
2. n-type silicon 220
3. depletion region 230
4. polysilicon gate 240
5. vias 250a and 250b
6. metal line 260
7. microlens 270

During operation, the active region 210 receives photons, which charges electrons 280a-f. The charged electrons create a voltage potential that allows an output signal to be generated.

The blooming effect, which is sometimes referred to as cross talk effect, is generally caused by two sources: light penetration and electron diffusion. The light penetration occurs when photons travel or bounce outside the active region of the pixel. The cross talk effect is typically caused by electrons diffusing into adjacent pixels.

There have been various conventional techniques for reducing blooming effects caused by light penetration. For example, microlens, implemented by way of metal shielding design, can be used to reduce light penetration. However, reducing light penetration is often inadequate. In addition, the implementation of microlenses can be expensive as pixel sizes become smaller.

Typically when a pixel operates, its photodiode is initially reset to a high voltage (Vr). As a result, the positive charge is stored in the n type silicon depletion region. Photons can generate electrons which can neutralize the positive charge. For example, the force of electric field neutralize the positive charge. Sometimes, diffusion neutralize the positive charge when electrons are generated outside the depletion region. As a result, the high voltage (Vr) is reduced by an voltage change (ΔV). The voltage change is essentially used as a signal for the amount of light being received. Thus, images are formed at the image sensor that determines the signal values for each pixel.

The technique as described above suffers from loss of image quality sometimes due to the material of the CMOS sensor. Because silicon is a poor absorber, many electrons do not stay at the silicon and are generated outside the depletion region. Those electrons can move towards all directions. For example, electrons flow according to concentration gradient. The distance electrons travel usually depends on the carrier lifetime and mobility.

As the pixel size becomes smaller, it becomes easier for electrons to travel to the from one pixel to another. As a result, image quality deteriorates.

Figure 3:
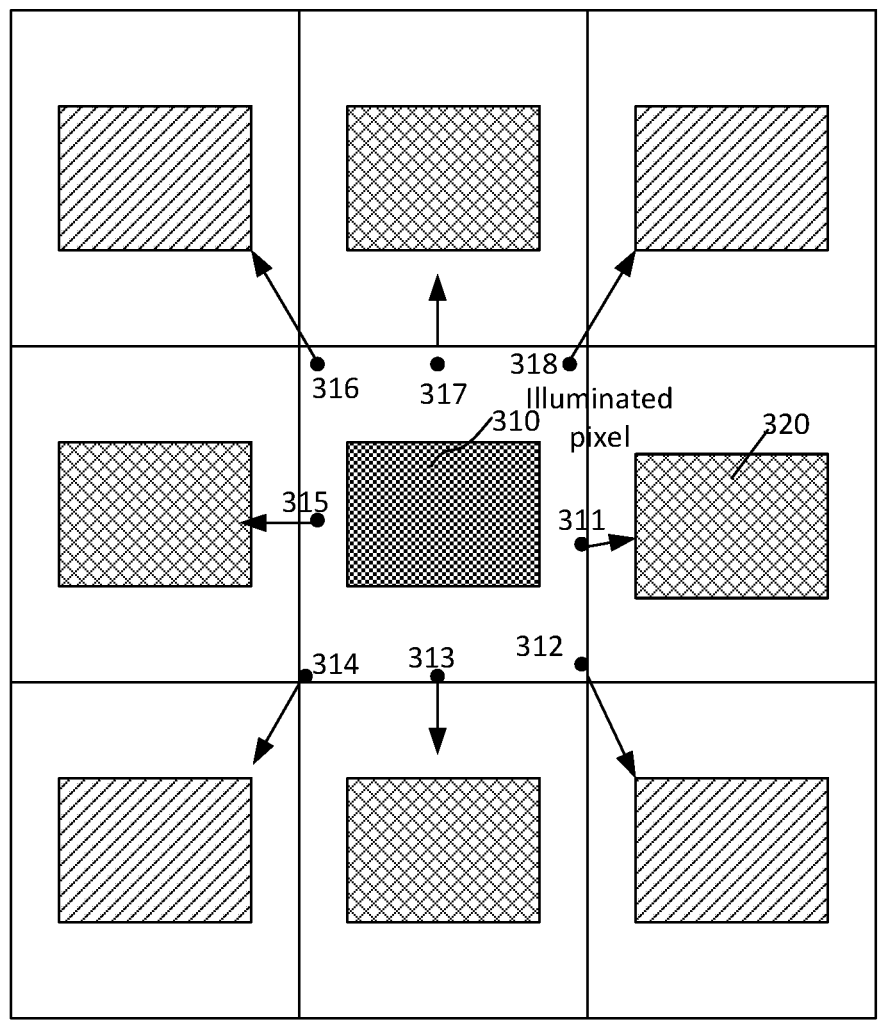
FIG. 3 is a simplified diagram illustrating blooming caused by electrons that penetrate through an active pixel to adjacent pixels.

FIG. 3 is a simplified diagram illustrating blooming caused by electron that penetrates through an active pixel to adjacent pixels. This diagram is merely an example, which should not unduly limit the scope of the claims. One of ordinary skill in the art would recognize many variations, alternatives, and modifications. As shown in FIG. 3, electrons 311-318 that carry energy of photons that are captured by a pixel 310, which is one of many pixels of an image sensor 300. When electrons carry large amount of energy, they often diffuse to adjacent pixels. For example, the electron 311 was initially charged at the pixel 310, but then diffuses to an adjacent pixel 320. As a result of the electron 311 traveling from the pixel 310 to the pixel 320, the capture image would exhibit blooming effect at the pixel 320.

Figure 4:
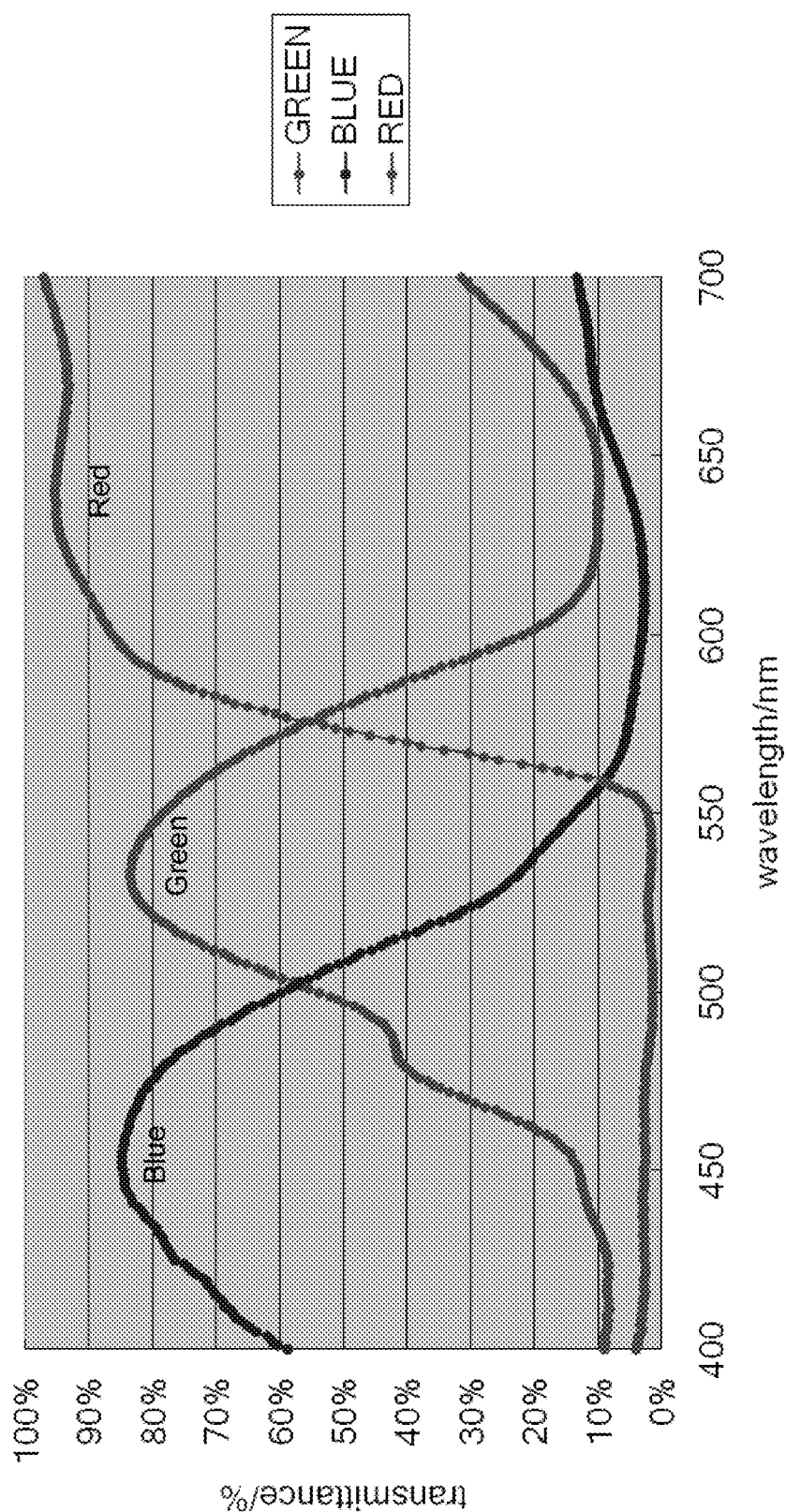
FIG. 4 is a simplified diagram illustrating the blooming effect on a normal image captured.

FIG. 4 is a simplified diagram illustrating the blooming effect on a normal image. This diagram is merely an example, which should not unduly limit the scope of the claims.

One of ordinary skill in the art would recognize many variations, alternatives, and modifications. At can be seen from FIG. 4, each capture color exhibit some blooming effect at different wavelengths.

Figure 5:
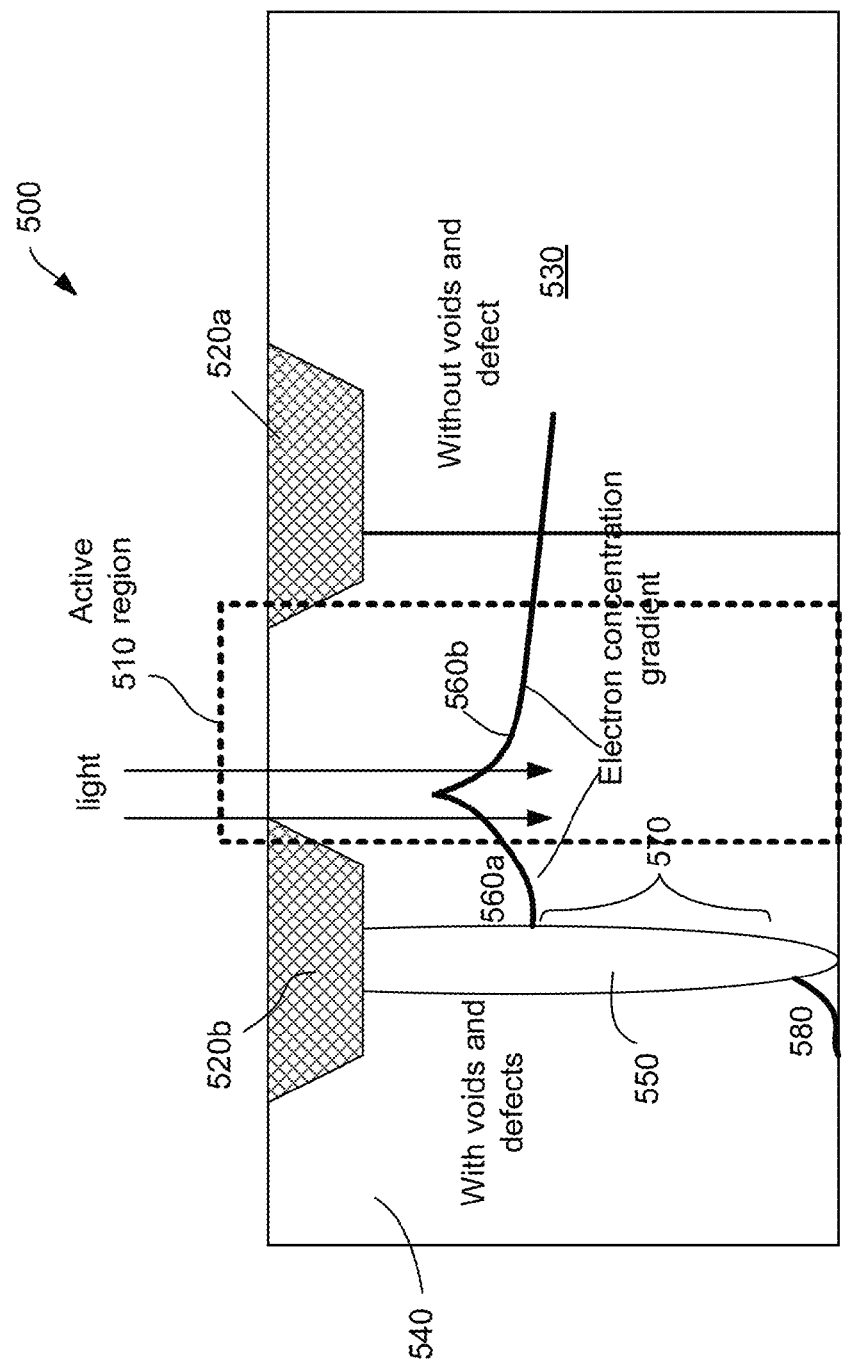
FIG. 5 is a simplified diagram illustrating an improved image pixel according to an embodiment of the present invention.

Therefore, it is desired to have an improve technique to reduce blooming effect. It is to be appreciated that the present invention addresses, among other things, blooming effect caused by photon-generated electrons diffusing into adjacent pixels. More specifically, certain embodiments of the present invention prevent electrons of one pixel from moving to another pixel. FIG. 5 is a simplified diagram illustrating an improved image pixel according to an embodiment of the present invention. This diagram is merely an example, which should not unduly limit the scope of the claims. One of ordinary skill in the art would recognize many variations, alternatives, and modifications.

As FIG. 5 illustrates, an improved pixel 500 for an image sensor includes an active region 510, non-active regions 530 and 540, and a barrier region 550. According to an embodiment, the improved pixel 500 is manufactured based on p-type substrate. For example, the non-active regions 530 and 540 are outside of the active region 510 and are essentially made of p-type substrate, which is essentially homogenous. The barrier region 550 is located outside the active region 510. For example, the barrier region 550 is located within the non-active region 540.

The barrier region 550 is used to create an energy barrier for electrons within the active region 510. The barrier regions may include recombination centers or traps, so that electrons are less likely to diffuse into adjacent pixels. For example, the barrier region 550 significantly reduces the likelihood that the electrons diffusing from the active region 510 to the non-active region 540. According to an embodiment, the barrier region 550 is doped with materials such as hydrogen materials. For example, the barrier region 550 doped with hydrogen material produces an energy gap between the active region 510 and the non-active region 550. When electrons diffuse from the active region 510 to the non-active region 540, the energy gap created at the barrier region 550 greatly reduces the lifetime of these diffusing electrons. For example, recombination rate is governed by the Shockley-Read-Hall theory. The advantage is explained in the following diagram. The dark curve represents the concentration gradient of the electrons experiencing defects and no defects while diffusing towards the adjacent pixels.

The function of the barrier region 550 may be demonstrated by concentration gradient curves for electrons. As shown on FIG. 5, the curve 560*b* is continuous, as there is no barrier region between the active region 510 and the non-active region 530. In contrast, the curve 560*a* intersected by the barrier region 550. As a result, diffusing electrons are significantly less likely to diffuse from the active region 510 to the non-active region 540. As shown by the curve 580, the concentration of diffusing electrons at the non-active region side of the barrier region 550 is much lower than the electron concentration at the active region side. The difference of electron concentration across the barrier region 550 may be demonstrated by the height 570.

Depending upon applications, the barrier region 550 may be doped other types of materials or includes voids. According to an embodiment, helium material is used to dope the barrier region 550. For example, the barrier region 550 contains helium material at a predetermined concentration. According to another embodiment, the barrier region 550 includes voids. For example, voids are formed by annealing the barrier region 550 that had already been doped with helium or hydrogen material. It is to be understood that the barrier region 550 may include hydrogen material, helium material, voids, or combinations thereof It is to be appreciated that according to various embodiments, the present invention provides a method for fabricating images sensors including barrier regions that provide the abovementioned benefits.

Figure 6:
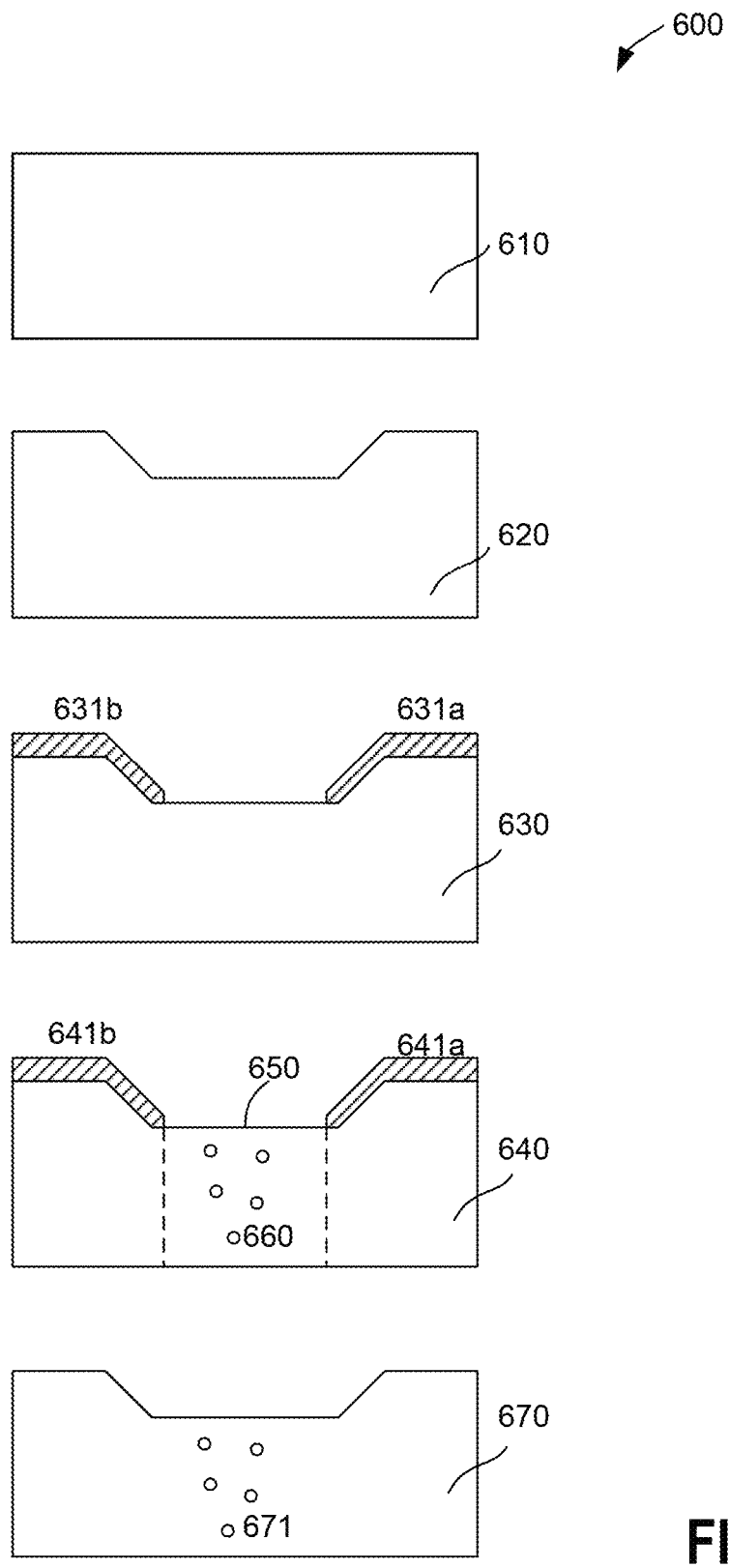
FIG. 6 is a simplified diagram illustrating a method for fabricating an image sensor including barrier regions according to an embodiment of the present invention.

FIG. 6 is a simplified diagram illustrating a method for fabricating an image sensor including barrier regions according to an embodiment of the present invention. This diagram merely provides an example, which should not unduly limit the claims. For examples, steps may be added, removed, replaced, repeated, overlapped, or partially overlapped.

The process 600 includes simplified diagrams of partially processed semiconductor materials for the fabrication of the image sensor. The process 600 starts with providing a substrate material 610. The substrate material can be characterized by dimensional characteristics such as a first dimension and a second dimension. Depending upon applications, the dimensions of the substrate material are determined by the desired size of image sensor. For example, the substrate material includes a 1/1.8 inch diagonal size that matches the sensor size of a consumer digital camera.

After the substrate material of an appropriate size is provided, the process 600 defines an active region on the substrate material. For example, the active region is defined as the region 510 in FIG. 5. The active region can be characterized by a third dimension and a fourth dimension. Depending upon applications, dimensions of the active region varies. For example, an image sensor with small area and high resolution (e.g., sensors from point-and-shoot cameras) typically has smaller active regions than that of an image sensor with large sensor area (e.g., sensors for digital single lens reflex cameras).

During the actual fabrication process, there can be various ways to define an active region. For example, trench etching method is used to produce the process substrate 620.

In addition to the active region, the process 600 also defines a non-active region on the substrate material. For example, the non-active region is defined as the region outside the region 510 in FIG. 5 and is different from the active region. The non-active region can be characterized by a fifth dimension and a sixth dimension. In some embodiments, the non-active region includes a silicon material. In certain embodiments, the non-active region include no junction regions. Depending upon applications, dimensions of the non-active region varies. For example, an image sensor with small area and high resolution typically has smaller non-active regions than that of an image sensor with large sensor area. Typically, the non-active region must be greater than a minimum size to prevent unwanted electron diffusion.

The process 600 also forms an n-type region positioned in the active region. In some embodiments, a depletion region is formed below the n-type region. Additionally, the process 600 provides a step for forming a gate region within the active region.

The process 600 additionally provides steps for forming a doped region within the non-active region. Depending upon applications, there are various way of forming a doped region with the non-active region. In a specific embodiment, a recessed region, or a trench, is formed in the substrate, and hard masks 631a and 631b are then deposited above the trenched substrate 630. On the substrate, an opening is provided between the hard masks 631a and 631b. In an embodiment, hard masks 631a and 631b include a dielectric material. In some embodiments, a photoresist layer can be used as the mask material. Next, doping materials are implanted onto the trenched substrate 630. According to various embodiments, hydrogen and/or helium are used as doping materials. There could be other materials used for doping as well. As can be seen from the diagram, doping materials are doped only within the 650 region, which is within the open area defined by the hard masks 641a and 641b.

Depending upon applications, the doping process is capable of making sure that the doping concentration is within a predetermined range of concentration. For example, different image sensors require different level of concentrations in terms of number of voids.

As described above, doping materials are used to create voids within the non-active region. In some embodiments, the doping materials are removed after the voids are created. Various methods can be used to remove doping materials. For example, an annealing process can be used to remove implanted hydrogen and/or helium.

After creating voids, the process 600 removes hard masks so a processed substrate material 670 with voids 671 is formed. The region containing voids is the non-active region that provides boundaries between active regions that prevents unwanted electron diffusions and cross talk effect.

It is to be appreciated that various steps of process 600 may be added, removed, replaced, repeated, overlapped, or partially overlapped. For example, the annealing process can be performed after the removal of hard mask. As another example, the doping or implantation process may be repeated to vary the void concentration at the non-active region.

According to an embodiment, the present invention provides a method for manufacturing a CMOS image sensor. Among other things, the CMOS image sensor is characterized by reduced blooming. The method includes a step for providing a substrate material. The substrate material can be characterized by a first dimension and a second dimension. In addition, the method includes a step for defining an active region on the substrate material. The active region is characterized by a third dimension and a fourth dimension. The method further includes a step for defining a non-active region on the substrate material. The non-active region is different from the active region. The non-active region is characterized by a fifth dimension and a sixth dimension, the non-active region including essentially pure silicon material. The method additionally includes a step for defining a depletion region within the active region. In addition, the method includes a step for forming an n-type region positioned above the depletion region. The n-type region is within the active region. Furthermore, the method includes a step for forming a gate region within the active region. In addition, the method includes a step for forming a doped region, the doped region being within the non-active region. The doped region is characterized by including at least one substance at a predetermined range of concentration. The doped region further can be characterized by a doping concentration. Moreover, the method includes a step for forming a plurality of voids within the doped region. For example, the method can be illustrate according FIG. 6 and the description thereof According to another embodiment, the present invention provides a pixel of a CMOS image sensor, which is characterized by reduced blooming. The pixel includes a p-type silicon substrate, which includes a top side and a bottom side. The pixel also includes an active region being defined inside the p-type silicon substrate. The active region includes a depletion region and a n-type silicon material. The active region is positioned within the p-type silicon substrate, wherein the active region is characterized by a first dimension and a second dimension. The pixel additionally includes at least one metal line positioned at the proximity of the top side. In addition, the pixel includes a non-active region. The non-active region is different from the active region. The non-active region can be characterized by a first energy state. The pixel also includes at least one barrier region being outside of the active region. The at least one barrier region is characterized by a second energy state. The second energy state is different from the first energy state. For example, the pixel of the CMOS image sensor can be illustrated according to FIG. 5 and the description thereof According to yet another embodiment, the present invention provides an image capturing device. The image capturing device includes a user interface being configured to facilitate an image capturing process. The image capturing device also includes a first input being configured to receive a user input, the user input being a command for capturing an image. Additionally, the image capturing device includes an image sensor being configured to capture an image. Furthermore, the image capturing device includes an optical device being positioned to provide a light to form an image on the image sensor. In addition, the image capturing device includes a processor being configured to process images. The image sensor includes a p-type silicon substrate, the p-type silicon substrate including a top side and a bottom side. The image sensor also includes an active region being defined inside the p-type silicon substrate. The active region includes a depletion region and a n-type silicon material. The active region is positioned within the p-type silicon substrate, wherein the active region is characterized by a first dimension and a second dimension. The image sensor additionally includes at least one metal line positioned at the proximity of the top side. The image sensor also includes a non-active region, the non-active region being different from the active region. The non-active region is characterized by a first energy state. Moreover, the image sensor includes at least one barrier region being outside of the active region. The at least one barrier region can be characterized by a second energy state. The second energy state is different from the first energy state. For example, the pixel of the CMOS image sensor can be illustrated according to FIG. 5 and the description thereof It is to be appreciated that the present invention provides various advantages. Embodiments of the present invention can reduce the blooming effect on certain CMOS based image sensors. For example, hydrogen or helium implantation is used in conjunction with annealing technology during the fabrication process of CMOS image sensors. For example, the hydrogen or helium implantations create voids at desired regions of CMOS image sensors. During the process of capturing images, these voids reduce electrons from diffusing into adjacent image sensor regions and thereby reduces the blooming effect. As merely an example, these voids function as recombination center and potential barriers for electrons. Depending upon applications, the dimension (e.g., depth) and distribution of these voids can be controlled. For example, various factors (e.g., photolithography techniques, implant energy, implant dosage, and annealing temperature and time) can be changed to adjust the property of voids based on desired applications.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A pixel of a CMOS image sensor characterized by reduced blooming comprising:
   a p-type silicon substrate, the p-type silicon substrate including a top side and a bottom side;
   an active region being defined inside the p-type silicon substrate, the active region including a depletion region and an n-type silicon material, the active region being positioned within the p-type silicon substrate, wherein the active region is characterized by a first dimension and a second dimension;
   at least one metal line positioned at the proximity of the top side;
   a non-active region, the non-active region being different from the active region, the non-active region being characterized by a first energy state; and
   at least one barrier region being outside of the active region, the at least one barrier region being characterized by a second energy state, the second energy state being different from the first energy state.

2. The pixel of claim 1 wherein the at least one barrier region includes a plurality of voids.

3. The pixel of claim 1 wherein the at least one barrier region includes hydrogen material.

4. The pixel of claim 1 wherein the at least one barrier region includes helium material.

5. The pixel of claim 1 wherein the at least one barrier region includes a plurality of voids, a helium material, and a hydrogen material.

6. The pixel of claim 1 wherein the substrate is characterized by one or more trenched position.

7. An image capturing device comprising:
   a user interface being configured to facilitate an image capturing process;
   a first input being configured to receive a user input, the user input being a command for capturing an image;
   an image sensor being configured to capture an image;
   an optical device being positioned to provide a light to form an image on the image sensor;
   a processor being configured to process images;
   wherein the image sensor comprises:
      a p-type silicon substrate, the p-type silicon substrate including a top side and a bottom side;
      an active region being defined inside the p-type silicon substrate, the active region including a depletion region and a n-type silicon material, the active region being positioned within the p-type silicon substrate, wherein the active region is characterized by a first dimension and a second dimension;
      at least one metal line positioned at the proximity of the top side;
      a non-active region, the non-active region being different from the active region, the non-active region being characterized by a first energy state; and
      at least one barrier region being outside of the active region, the at least one barrier region being characterized by a second energy state, the second energy state being different from the first energy state.

8. The image capturing device of claim 7 is a camera phone.

9. The image capturing device of claim 7 is a digital camera.

10. The image capturing device of claim 7 is a web camera.

11. The image capturing device of claim 7 is a personal digital assistant (PDA).

* * * * *